United States Patent
Okawa et al.

(10) Patent No.: US 10,629,612 B2
(45) Date of Patent: Apr. 21, 2020

(54) MEMORY DEVICE

(71) Applicant: TOSHIBA MEMORY CORPORATION, Minato-ku (JP)

(72) Inventors: Takamasa Okawa, Yokkaichi (JP); Tetsuji Kunitake, Kuwana (JP); Takuji Kanebishi, Yokkaichi (JP); Yusuke Takagi, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/048,805

(22) Filed: Jul. 30, 2018

(65) Prior Publication Data
US 2019/0287986 A1   Sep. 19, 2019

(30) Foreign Application Priority Data

Mar. 15, 2018 (JP) .................. 2018-048254

(51) Int. Cl.
*H01L 27/11582*  (2017.01)
*H01L 27/11565*  (2017.01)
*H01L 27/1157*  (2017.01)

(52) U.S. Cl.
CPC .... *H01L 27/11582* (2013.01); *H01L 27/1157* (2013.01); *H01L 27/11565* (2013.01)

(58) Field of Classification Search
CPC ........... H01L 27/11565; H01L 27/1157; H01L 27/11582
See application file for complete search history.

(56) References Cited

U.S. PATENT DOCUMENTS

| | | | |
|---|---|---|---|
| 9,691,786 B1 * | 6/2017 | Tsuji | H01L 27/11582 |
| 2011/0073866 A1 | 3/2011 | Kim et al. | |
| 2017/0236834 A1 | 8/2017 | Fukumura | |
| 2018/0151672 A1 * | 5/2018 | Choi | H01L 27/11524 |

* cited by examiner

*Primary Examiner* — Zandra V Smith
*Assistant Examiner* — Molly K Reida
(74) *Attorney, Agent, or Firm* — Oblon, McClelland, Maier & Neustadt, L.L.P.

(57) ABSTRACT

A memory device includes first to third electrode layers and first to third columnar bodies. The first electrode layers are stacked above a foundation layer. The second and third electrode layers are arranged above the first electrode layers in a direction crossing a stacking direction of the first electrode layers. The first columnar body extends through the first and second electrode layers. The second columnar body extends through the first and third electrode layers. The third columnar body extends through the first electrode layers, and is positioned between the second electrode layer and the third electrode layer. The first to third columnar bodies include first to third semiconductor layers, respectively. The first and second semiconductor layers are electrically connected to the foundation layer, and the third semiconductor layer is electrically insulated from the foundation layer by an insulating film provided between the foundation layer and the third semiconductor layer.

19 Claims, 13 Drawing Sheets

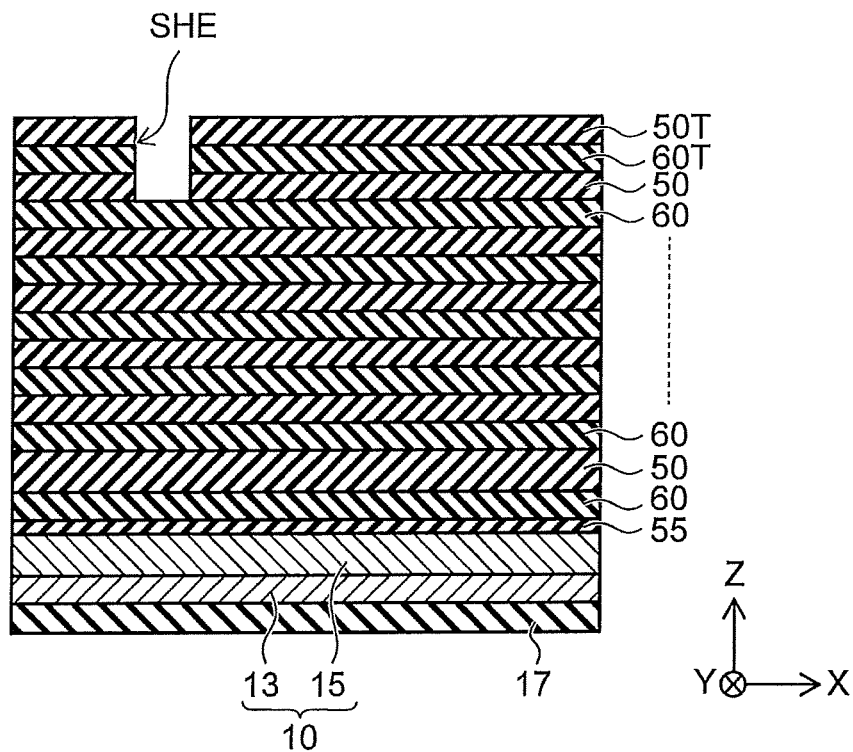
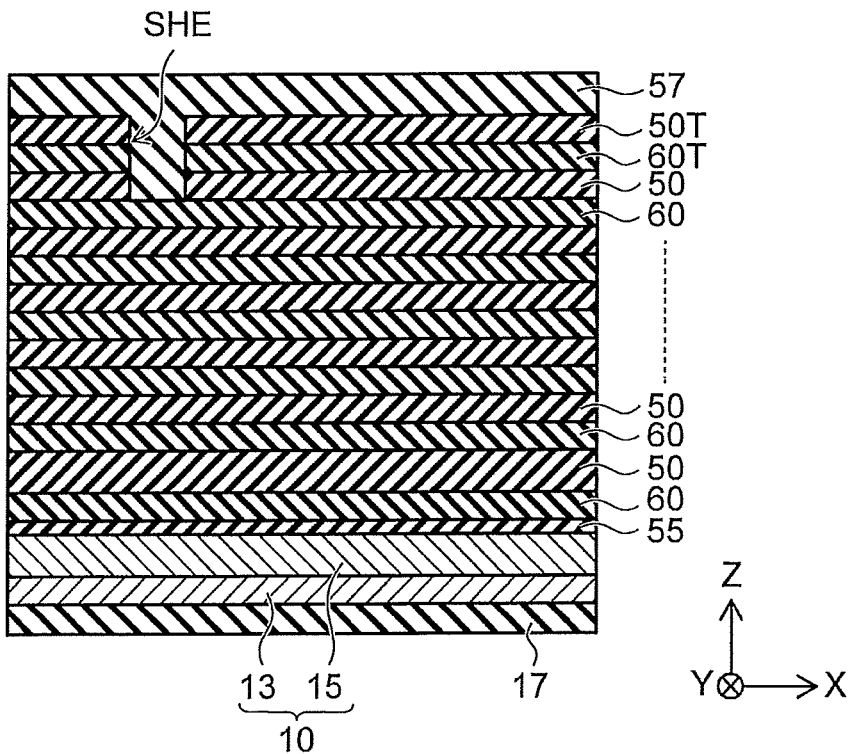

MEMORY DEVICE

CROSS-REFERENCE TO RELATED APPLICATIONS

This application is based upon and claims the benefit of priority from Japanese Patent Application No. 2018-048254, filed on Mar. 15, 2018; the entire contents of which are incorporated herein by reference.

FIELD

Embodiments relate to a memory device.

BACKGROUND

There is a memory device having a three-dimensional structure in which multiple word lines are stacked; and the three-dimensional structure includes semiconductor layers provided in memory holes extending in the stacking direction through the multiple word lines. In such a memory device, defects in the memory holes may cause degradation over time of the electrical isolation between the word lines and the semiconductor layers.

BRIEF DESCRIPTION OF THE DRAWINGS

FIGS. 3A to 10B are schematic views showing manufacturing processes of the memory device according to the first embodiment;

DETAILED DESCRIPTION

Figure 1A:
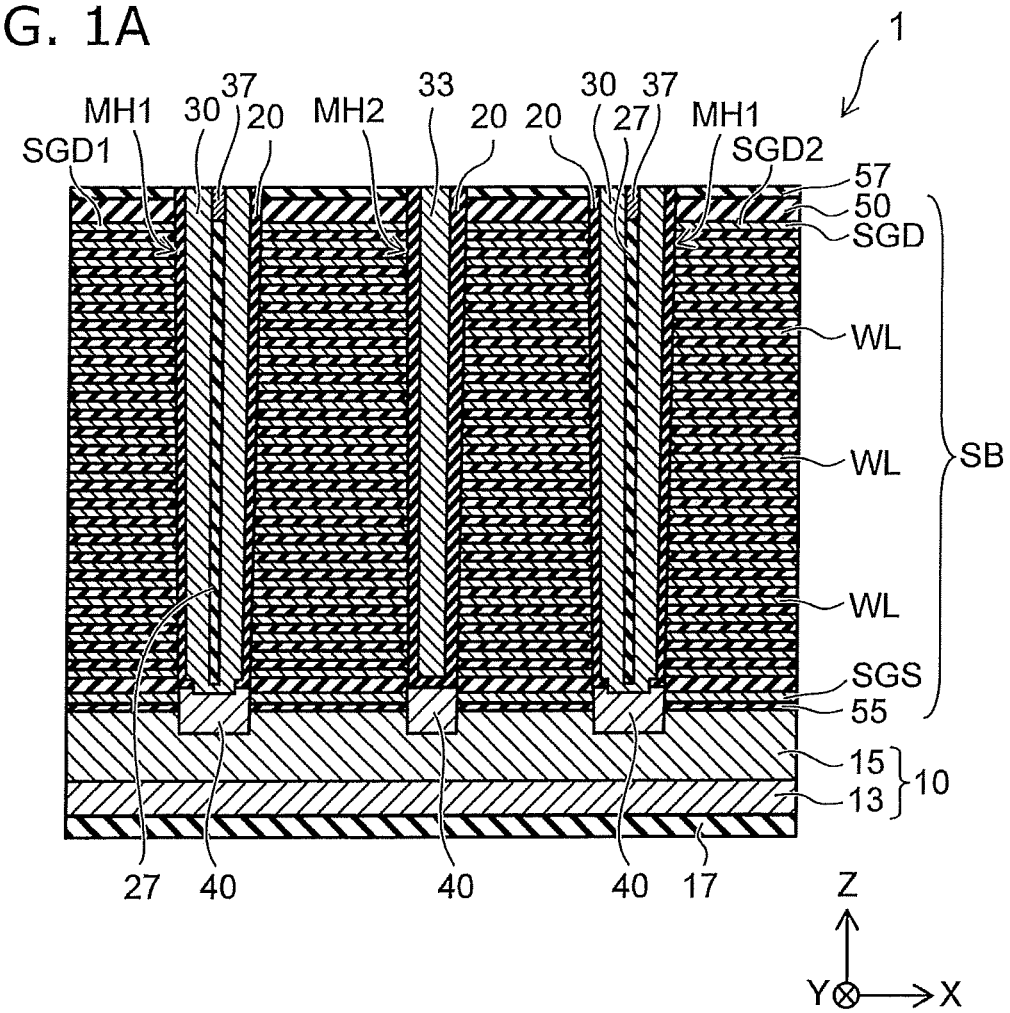
FIGS. 1A and 1B are schematic views showing a memory device according to a first embodiment.

According to one embodiment, a memory device includes a foundation layer of conductive or semi-conductive, a plurality of first electrode layers stacked above the foundation layer. The device further includes a second electrode layer, a third electrode layer, a first columnar body and a second columnar body. The second electrode layer is provided above the plurality of first electrode layers. The third electrode layer is provided above the plurality of first electrode layers, and arranged with the second electrode layer in a first direction crossing a stacking direction of the plurality of first electrode layers. The first columnar body extends through the plurality of first electrode layers and the second electrode layer in the stacking direction. The first columnar body includes a first semiconductor layer extending in the stacking direction. The second columnar body extends in the stacking direction through the plurality of first electrode layers and the third electrode layer. The second columnar body includes a second semiconductor layer extending in the stacking direction. The device further includes a third columnar body extending in the stacking direction through the plurality of first electrode layers. The third columnar body is positioned between the second electrode layer and the third electrode layer. The third columnar body includes a third semiconductor layer extending in the stacking direction. The first semiconductor layer and the second semiconductor layer are electrically connected to the foundation layer. The third columnar body includes an insulating film positioned between the foundation layer and the third semiconductor layer. The insulating film electrically insulates the third semiconductor layer from the foundation layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

Figure 1B:
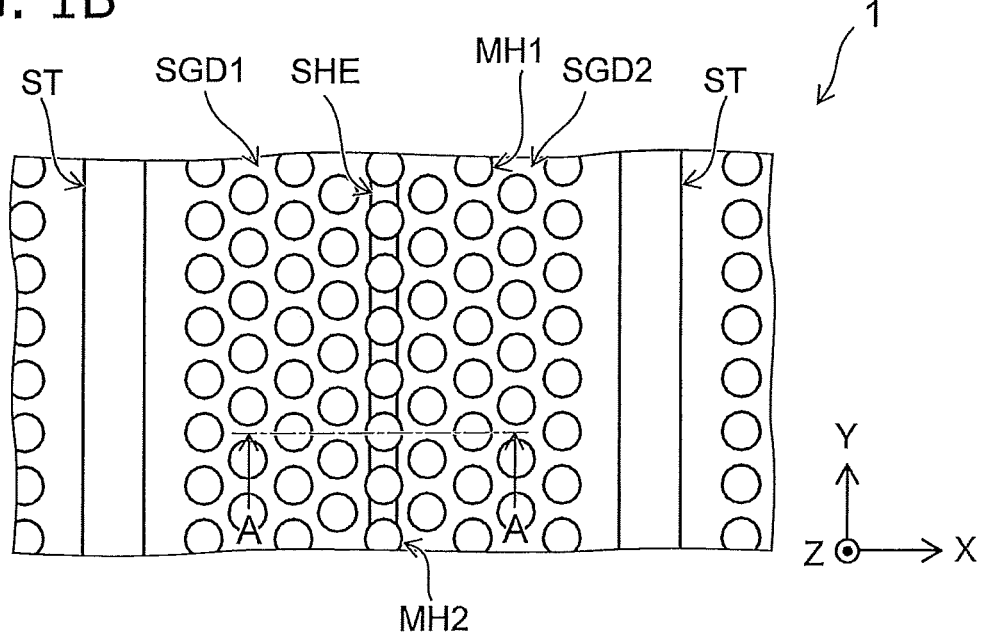

FIGS. 1A and 1B are schematic views showing a memory device 1 according to a first embodiment. FIG. 1A is a schematic cross-sectional view showing the memory device 1 and illustrates a cross section along line A-A shown in FIG. 1B. FIG. 1B is a schematic view illustrating the upper surface of a select gate SGD on the drain side shown in FIG. 1A.

As shown in FIG. 1A and FIG. 1B, the memory device 1 includes multiple memory holes MH. The memory holes MH are provided to extend through electrode layers defined by a first slit ST. A memory hole MH1 and a memory hole MH2 are provided in a memory region of the memory device 1. Hereinbelow, there are cases where the memory holes MH1 and MH2 are described individually, and cases where both the memory holes MH1 and MH2 are generally called the memory holes MH.

The memory device 1 includes the first slit ST and a second slit SHE. The first slit ST extends in a Y-direction and defines the outer edges of the multiple electrode layers (hereinbelow, described as a select gate SGS, word lines WL, and the select gate SGD) stacked in a Z-direction. The second slit SHE extends in the Y-direction and divides the select gate SGD which is the uppermost layer of the multiple electrode layers defined by the first slits ST at, for example, the center of the select gate SGD.

The select gate SGD includes a select gate SGD1 and a select gate SGD2 positioned on two sides of the second slit SHE. The select gates SGD1 and SGD2 each are disposed above the multiple word lines WL stacked in the Z-direction.

The memory holes MH are arranged periodically between the first slits ST. For example, the memory holes MH are disposed to be arranged in one column in the Y-direction; and the multiple columns that extend in the Y-direction are disposed to be shifted alternately by a half period in an X-direction. The memory holes MH are disposed in a so-called staggered configuration.

The memory holes MH1 are disposed on two sides of the second slit SHE; and the memory holes MH2 are provided on the second slit SHE, that is, between the two select gates SGD divided by the second slit SHE. The memory hole MH2 extends through the multiple word lines WL in the Z-direction and is provided to extend in the Z-direction between the select gate SGD1 and the select gate SGD2. The multiple memory holes MH2 are disposed to be arranged along the second slit SHE.

As shown in FIG. 1A, the memory device 1 includes a stacked body SB and a source layer 10. For example, the source layer 10 has a structure in which a metal layer 13 and a semiconductor layer 15 are stacked in order on an inter-layer insulating film 17. The stacked body SB includes the select gate SGS, the multiple word lines WL, and the select gate SGD and is provided above the semiconductor layer 15. The select gate SGD is provided above the word lines WL and is divided by the second slit SHE. The source layer 10 that is used to form the foundation layer of the stacked body SB is not limited to the stacked structure of the metal layer 13 and the semiconductor layer 15 as long as the source layer 10 has a conductive or a semiconductive structure; for example, a well layer that is formed inside a semiconductor substrate may be used as the source layer 10.

The memory hole MH1 extends in the Z-direction through the stacked body SB. A memory film 20, an insulating core 27, and a semiconductor layer 30 are disposed in the memory hole MH1. The memory film 20 extends in the Z-direction along the inner wall of the memory hole MH1. The insulating core 27 extends in the Z-direction in the interior of the memory hole MH1. The semiconductor layer 30 is positioned between the memory film 20 and the insulating core 27 and extends in the Z-direction along the memory film 20. A columnar body that includes the memory film 20, the insulating core 27, and the semiconductor layer 30 is provided in the memory hole MH1.

A semiconductor layer 40 is provided on the bottom surface of the memory hole MH1. The lower end of the semiconductor layer 30 is connected to the semiconductor layer 40; and the lower surface of the semiconductor layer 40 is connected to the semiconductor layer 15. In other words, the semiconductor layer 30 is electrically connected to the source layer 10 via the semiconductor layer 40.

The memory hole MH2 is disposed between the two select gates SGD1 and SGD2, and extends in the Z-direction through the select gate SGS and the multiple word lines WL. The memory film 20 and a semiconductor layer 33 are disposed in the memory hole MH2. The memory film 20 extends in the Z-direction along the inner wall of the memory hole MH2. The semiconductor layer 33 extends in the Z-direction along the memory film 20. A columnar body that includes the memory film 20 and the semiconductor layer 33 is provided in the memory hole MH2.

The semiconductor layer 40 is provided also on the bottom surface of the memory hole MH2. A portion of the memory film 20 is interposed between the semiconductor layer 40 and the lower end of the semiconductor layer 33. The semiconductor layer 33 is electrically insulated from the semiconductor layer 40 by the memory film 20. In other words, the semiconductor layer 33 that is provided in the memory hole MH2 is electrically insulated from the source layer 10.

Figure 2A:
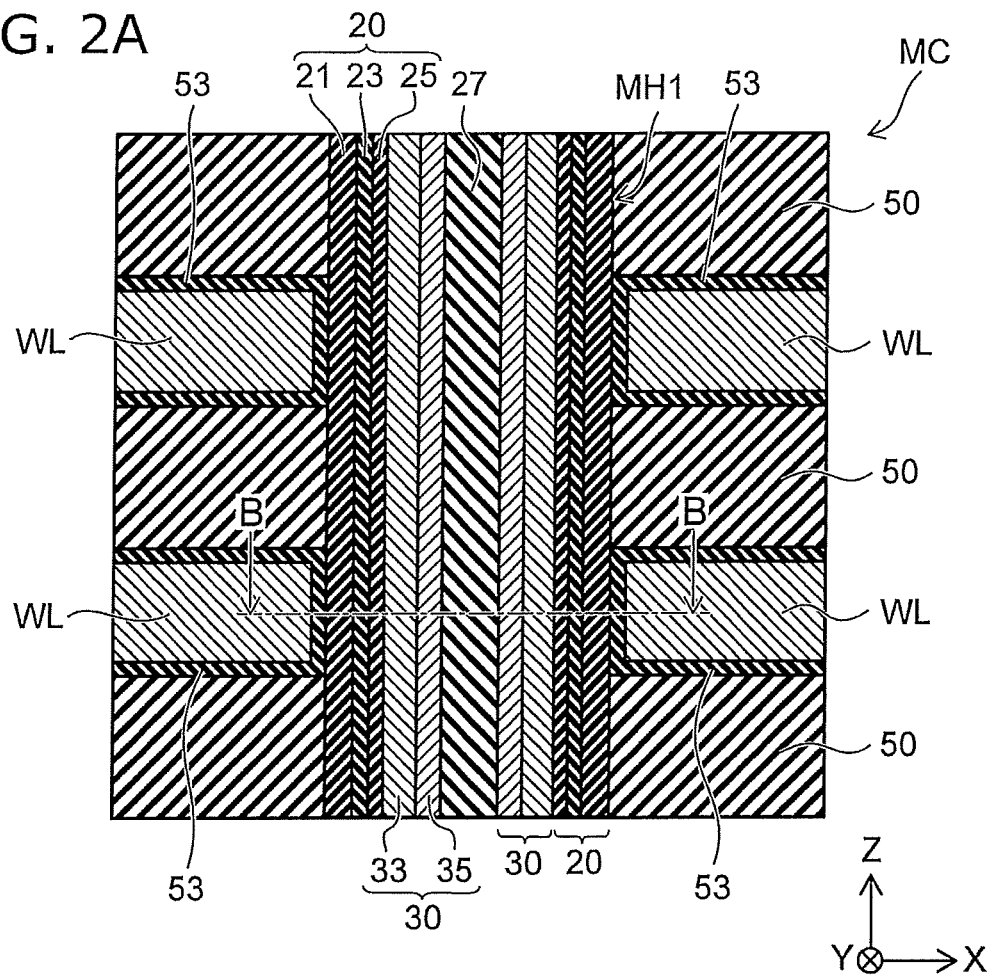
FIGS. 2A and 2B are schematic cross-sectional views showing memory cells of the memory device according to the first embodiment.
Figure 2B:
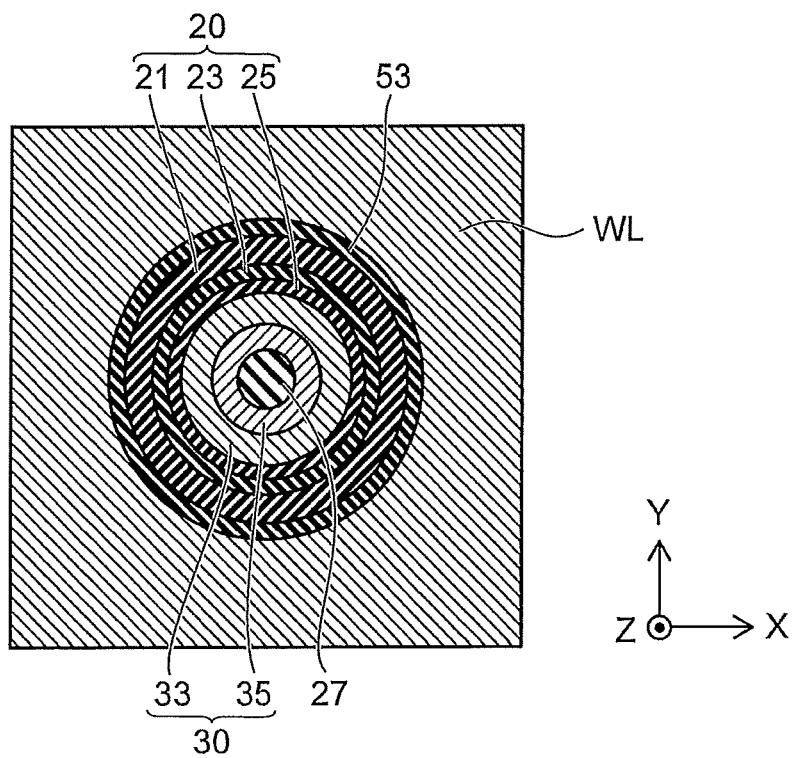

FIGS. 2A and 2B are schematic cross-sectional views showing memory cells MC of the memory device 1 according to the first embodiment. For example, FIG. 2A is a partial cross-sectional view schematically showing a portion of the cross section along line A-A shown in FIG. 1B. FIG. 2B is a schematic view showing a cross section along line B-B shown in FIG. 2A.

As shown in FIG. 2A, the word lines WL are stacked in the Z-direction with insulating films 50 interposed. The memory film 20, the semiconductor layer 30, and the insulating core 27 are provided in the interior of the memory hole MH1 piercing the multiple word lines WL. The insulating core 27 is, for example, silicon oxide extending in the Z-direction. The semiconductor layer 30 extends in the Z-direction along the insulating core 27.

The memory film 20 includes, for example, insulating films 21, 23, and 25. The insulating films 21, 23, and 25 are stacked in order on the inner wall of the memory hole MH1. The insulating films 21 and 25 are, for example, silicon oxide films. The insulating film 23 is, for example, a silicon nitride film.

As shown in FIG. 2A, the memory device 1 further includes an insulating film 53 positioned between the insulating film 21 and the word line WL. The insulating film 53 extends also between the insulating film 50 and the word line WL. The insulating film 53 is, for example, an aluminum oxide film.

As shown in FIG. 2B, the memory film 20 is provided to surround the semiconductor layer 30 along the inner surface of the memory hole MH1. The semiconductor layer 30 is positioned between the memory film 20 and the insulating core 27 and is provided to surround the insulating core 27.

The memory cells MC of the memory device 1 are arranged in the Z-direction along the semiconductor layer 30, and include charge retaining regions positioned between the semiconductor layer 30 and the word lines WL. In each of the memory cells MC, the insulating films 21 and 53 function as, for example, blocking insulating films; and the insulating film 23 functions as, for example, a charge storage film. The insulating film 25 functions as, for example, a tunneling insulating film.

In the example, the semiconductor layer 30 includes the semiconductor layers 33 and 35. The semiconductor layers 33 and 35 are, for example, polysilicon layers. The semiconductor layer 30 may be a polysilicon layer in which the semiconductor layers 33 and 35 are formed as one body.

As shown in FIG. 1A, the memory film 20 and the semiconductor layer 33 are formed also in the memory hole MH2; but the memory cells MC are not provided at the portions where the memory hole MH2 extends through the word lines WL. In other words, the portions where the memory film 20 and the semiconductor layer 33 cross the word lines WL do not function as the memory cells MC, because the semiconductor layer 33 provided in the memory hole MH2 is electrically insulated from the source layer 10.

A method for manufacturing the memory device 1 according to the embodiment will now be described with reference to FIG. 3A to FIG. 10B.

FIGS. 3A to 10B are schematic views sequentially showing manufacturing processes of the memory device 1. FIGS. 3A, 3B, and 4B to 10B are schematic views showing partial cross-sections corresponding to the cross section along line A-A shown in FIG. 1B. FIG. 4A is a schematic plan view corresponding to a portion of the upper surface of the select gate SGD shown in FIG. 1A.

As shown in FIG. 3A, insulating films 50 and sacrificial films 60 are formed alternately above the source layer 10. For example, the source layer 10 is formed on a silicon wafer with an inter-layer insulating film 17 interposed. An insulating film 55 is formed on the source layer 10; and a sacrificial film 60, which is the lowermost film of the sacrificial films 60, is formed on the insulating film 55.

Although the number of the sacrificial films 60 is the same as the number of electrode layers stacked above the source layer 10, fewer sacrificial films 60 are illustrated for convenience in FIG. 3A and subsequent drawings comparing with the example shown in FIG. 1A.

The source layer 10 includes, for example, the metal layer 13 and the semiconductor layer 15. The metal layer 13 is formed on the inter-layer insulating film 17 and includes a metal such as tungsten, etc. The semiconductor layer 15 is formed on the metal layer 13 and includes, for example, polysilicon.

The insulating films 50 and 55 are, for example, silicon oxide films. The sacrificial film 60 is, for example, a silicon nitride film. The insulating films 50 and 55 and the sacrificial film 60 are formed, for example, using CVD (Chemical Vapor Deposition).

Then, the second slit SHE is formed from the front surface of an insulating film 50T that is the uppermost film of the insulating films 50. The second slit SHE extends in the Y-direction and divides the insulating film 50T and a sacrificial film 60T of the uppermost layer (referring to FIG. 1B). At least one sacrificial film 60 is divided by the second slit SHE, and the divided portions are to be replaced with the select gates SGD.

As shown in FIG. 3B, an insulating film 57 is formed on the insulating film 50T. The insulating film 57 is formed to fill the second slit SHE. The insulating film 57 is, for example, a silicon oxide film formed using CVD.

Figure 4A:
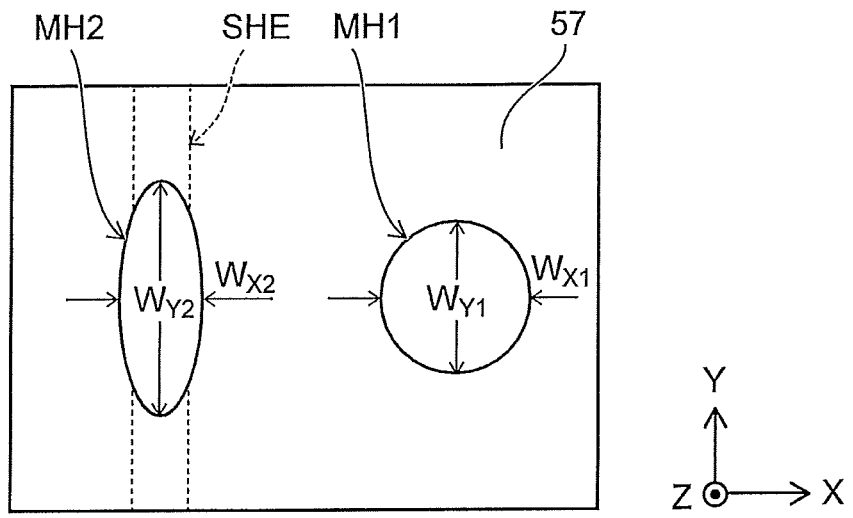
Figure 4B:
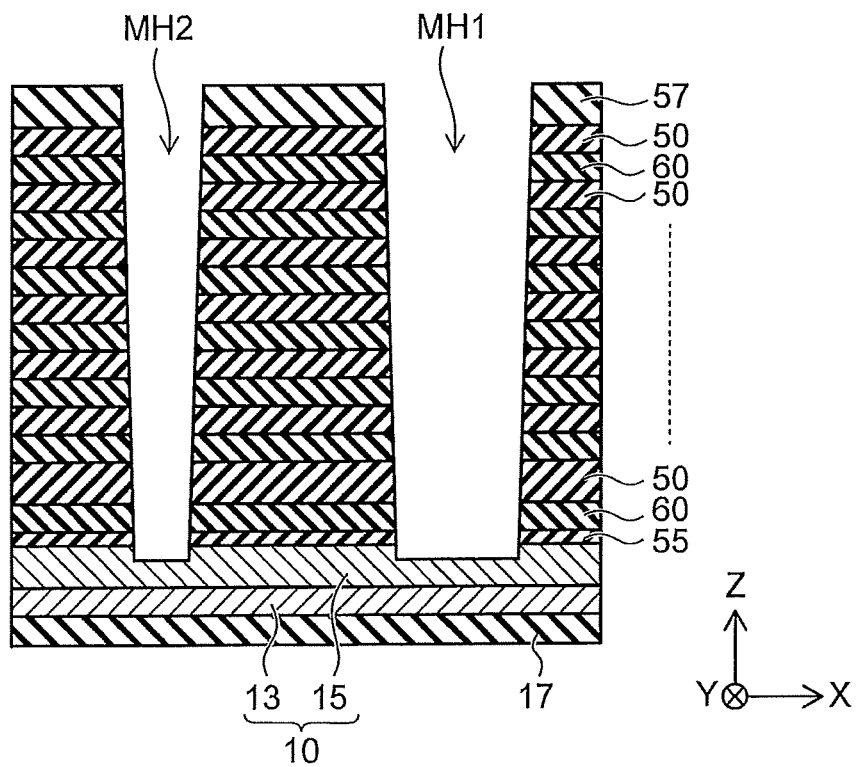

As shown in FIGS. 4A and 4B, the memory holes MH are formed with depths from the upper surface of the insulating film 57 such that the bottoms thereof reach the semiconductor layer 15. For example, the memory holes MH are formed by selectively removing the insulating films 57, 50, and 55 and the sacrificial films 60 by using anisotropic RIE (Reactive Ion Etching).

As shown in FIG. 4A, for example, the memory hole MH1 is formed to have a circular opening. The memory hole MH2 is formed to overlap the second slit SHE and has, for example, an elliptical opening. The memory holes MH1 and MH2 are not limited to this combination. For example, the memory hole MH1 may have an opening in which an opening width in the Y-direction is different from an opening width in the X-direction.

The memory hole MH1 has an opening width $W_{X1}$ and an opening width $W_{Y1}$; and the memory hole MH2 has an opening width $W_{X2}$ and an opening width $W_{Y2}$. For example, the memory hole MH2 is formed so that the opening width $W_{Y2}$ is wider than the opening width $W_{X2}$. For example, the memory hole MH2 has the opening width $W_{Y2}$ in the extending direction of the second slit SHE and has the opening width $W_{X2}$ in a direction crossing the second slit SHE (e.g., the X-direction). The ratio ($W_{Y2}/W_{X2}$) of $W_{Y2}$ to $W_{X2}$ is formed to be larger than the ratio ($W_{Y1}/W_{X1}$) of $W_{Y1}$ to $W_{X1}$. For example, the memory hole MH1 is formed to be substantially a circle in which $W_{Y1}/W_{X1}$ is near 1; and the memory hole MH2 is formed to be a substantially ellipse in which $W_{Y2}/W_{X2}$ is greater than 1.

The memory hole MH2 is formed in a so-called tapered configuration in which the aspect ratio increases as the number of stacks of the sacrificial layers 60 increases; and the bottom surface area of the memory hole MH2 is narrower than the opening surface area. Therefore, in the case where the opening width $W_{X2}$ of the memory hole MH2 is set to be narrower than the opening width $W_{X1}$ of the memory hole MH1, there is a risk that the memory hole MH2 may not reach the source layer 10. As described below, it is desirable for the memory hole MH2 to reach the source layer 10. Therefore, it is preferable to ensure an opening surface area of the memory hole MH2 so that the memory hole MH2 can reach the source layer 10 while maintaining an opening width $W_{X2}$ of the memory hole MH2 that is narrower than the opening width $W_{X1}$ of the memory hole MH1. In other words, it is desirable for the memory hole MH2 to be formed to have a substantially elliptical opening in which the opening width $W_{Y2}$ is wider than the opening width $W_{X2}$.

For example, the memory hole MH2 is formed so that the opening surface area of the memory hole MH2 is substantially the same as the opening surface area of the memory hole MH1 or wider than the opening surface area of the memory hole MH1. Thereby, even in the case where the memory holes MH are formed in tapered configurations and the bottom surface areas of the memory holes MH are narrower than the opening surface areas, the memory hole MH2 can be formed with a depth such that the bottom thereof reaches the source layer 10.

Also, it is desirable for the opening of the memory hole MH2 to have the major diameter (the opening width $W_{Y2}$) in the extending direction of the second slit SHE. For example, the memory cells MC are not disposed at the portions where the memory hole MH2 extending through the word lines WL. Therefore, the spacing between the memory holes MH2 arranged in the extending direction of the second slit SHE can be set to be narrower than the spacing between the memory holes MH1. In other words, in the extending direction of the second slit SHE, the major diameter of the memory hole MH2 can be set to be longer.

The embodiment is not limited to the example. For example, the sizes of the openings of the memory holes MH1 and MH2 are dependent on the etching conditions of the insulating films 57, 50, and 55 and the sacrificial films 60. In other words, when the etching conditions are selected to suppress the etching characteristics causing the memory holes MH to have tapered configurations in the depth direction, for example, the opening of the memory hole MH2 can be set to be substantially a circle; and the diameter of the opening of the memory hole MH2 can be set to be smaller than the diameter of the memory hole MH1. Also, it is unnecessary for the direction of the major diameter of the memory hole MH2 to be aligned with the extending direction of the second slit SHE.

Figure 5A:
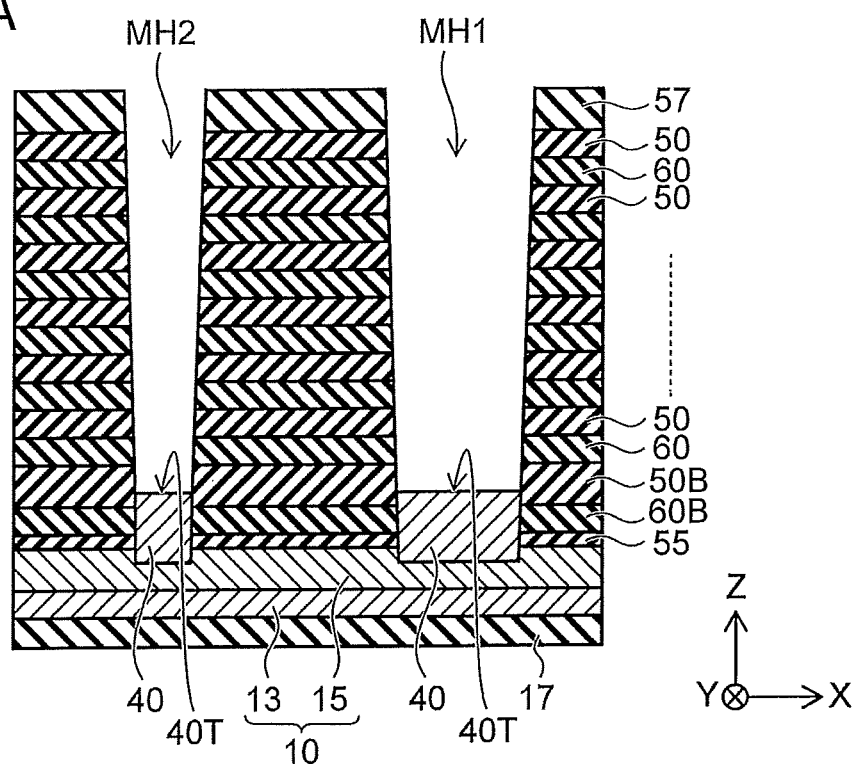

As shown in FIG. 5A, the semiconductor layers 40 are formed on the bottom surfaces of the memory holes MH. The semiconductor layers 40 are, for example, silicon layers epitaxially grown on the semiconductor layer 15. For example, the semiconductor layers 40 are formed under conditions set so that the semiconductor layers 40 are not deposited on the insulating films 50, 55, and 57 and the sacrificial films 60 exposed at the inner wall of the memory holes MH, whereas being selectively grown on the semiconductor layer 15 exposed at the bottom surfaces of the memory holes MH. Also, the semiconductor layer 40 is formed so that an upper surface 40T is positioned at a level between a sacrificial film 60B and the sacrificial film 60 adjacent to the sacrificial film 60B. Here, the sacrificial film 60B is the sacrificial film 60 positioned at the lowermost level of the multiple sacrificial films 60.

Figure 5B:
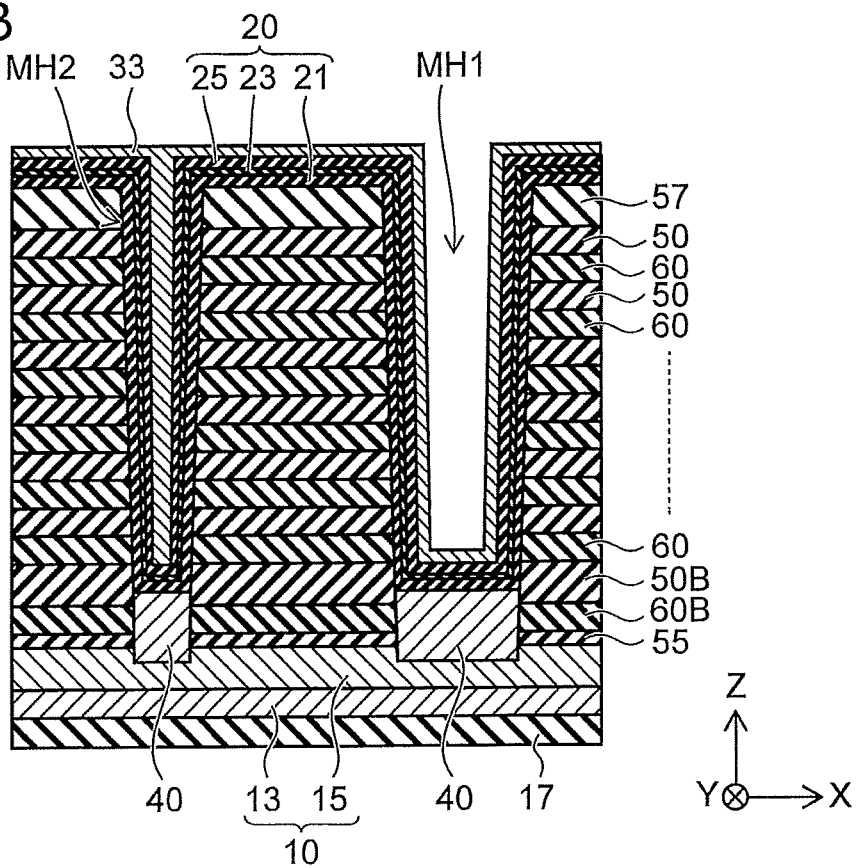

As shown in FIG. 5B, the memory film 20 that covers the inner surfaces of the memory holes MH is formed by sequentially forming the insulating films 21, 23, and 25. The insulating film 21 and the insulating film 25 are, for example, silicon oxide films; and the insulating film 23 is, for example, a silicon nitride film. For example, the insulating films 21, 23, and 25 are formed using CVD.

Then, the semiconductor layer 33 is formed on the insulating film 25. The semiconductor layer 33 is, for example, an amorphous silicon layer formed using CVD. The semiconductor layer 33 fills the interior of the memory hole MH2, and is formed so that a space remains in the memory hole MH1. In other words, the memory hole MH2 has an opening width $W_{X2}$ capable of the semiconductor layer 33 being formed such that a space remains in the memory hole MH1 and a space inside the memory hole MH2 is plugged (referring to FIG. 4A).

Figure 6A:
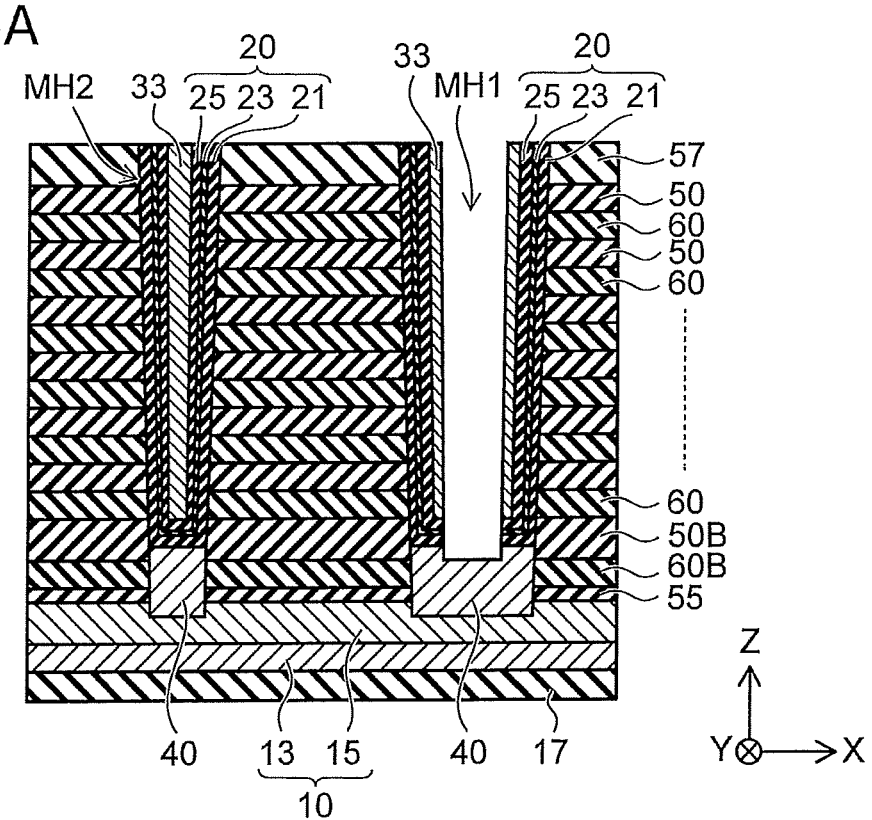

As shown in FIG. 6A, portions of the memory film 20 and the semiconductor layer 33 are selectively removed, which are formed at a higher level than the insulating film 57, and are formed on the bottom surface of the memory hole MH1. For example, the memory film 20 and the semiconductor layer 33 are selectively removed using anisotropic RIE so that a portion formed on the inner wall of the memory hole MH1 remains. Since the memory hole MH2 is plugged with the semiconductor layer 33, the portion of the memory film 20 formed on the bottom surface of the memory hole MH2 is maintained without being etched.

Figure 6B:
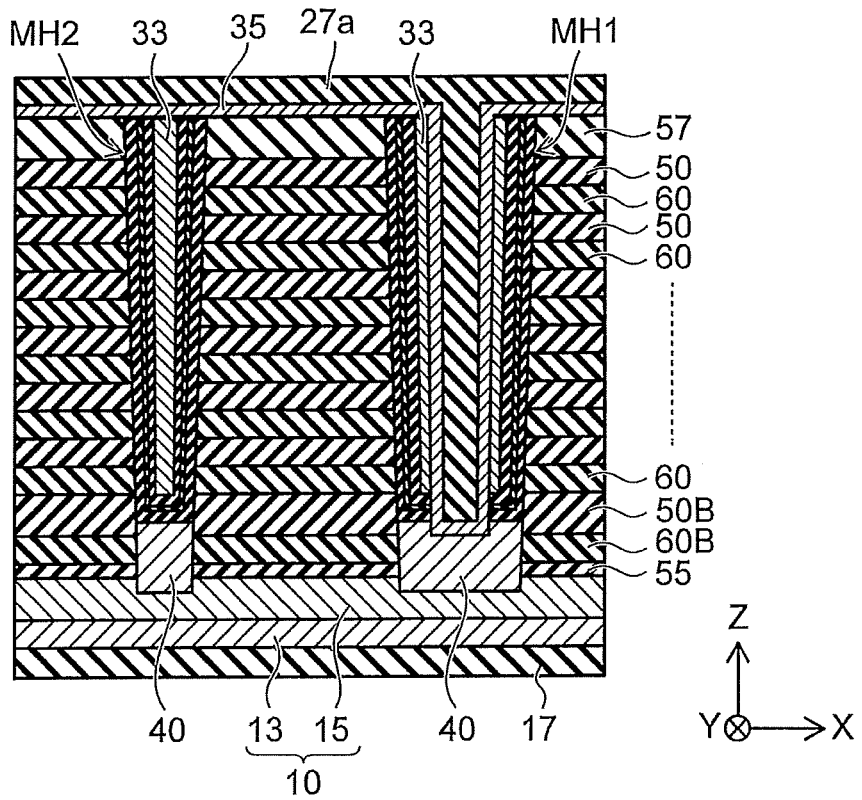

As shown in FIG. 6B, a semiconductor layer 35 is formed to cover the inner surface of the memory hole MH1 and the upper surface of the insulating film 57. The semiconductor layer 35 is formed to cover the memory hole MH2 filled with the memory film 20 and the semiconductor layer 33. The semiconductor layer 35 is, for example, an amorphous silicon layer and is formed to contact the semiconductor layer 40 at the bottom of the memory hole MH1. Then, an insulating film 27a is formed to fill the interior space of the memory hole MH1. The insulating film 27a is, for example, a silicon oxide film formed using CVD.

Figure 7A:
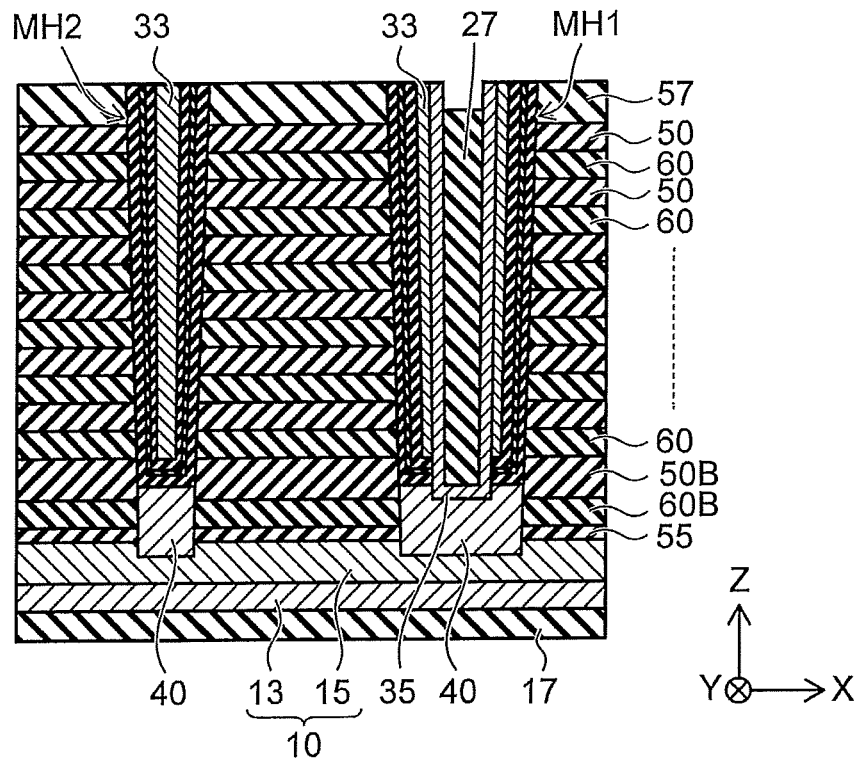

As shown in FIG. 7A, the insulating film 27a and the semiconductor layer 35 are removed; and the insulating film 57 and the semiconductor layer 33 filled into the memory hole MH2 are exposed. For example, etch-back of the insulating film 27a is performed; and after forming the insulating core 27 in the interior of the memory hole MH1, the semiconductor layer 35 is selectively removed to expose the insulating film 57.

Further, for example, the semiconductor layers 33 and 35 are crystallized to be polysilicon layers by heat treatment. Hereinbelow, a polysilicon layer in which the semiconductor layers 33 and 35 are formed as one body will be described as the semiconductor layer 30.

Figure 7B:
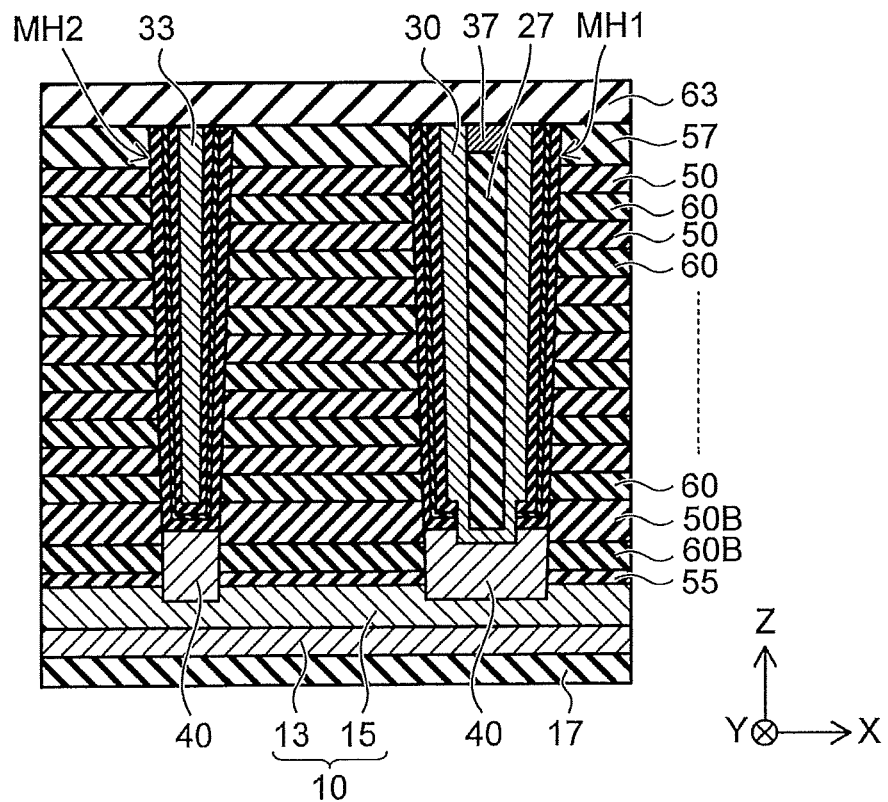

As shown in FIG. 7B, a capping layer 37 is formed to fill the space on the insulating core 27. The capping layer 37 is, for example, an amorphous silicon layer and is formed to fill the upper portion of the memory hole MH1 and contact the semiconductor layer 30. Then, an insulating film 63 is formed to cover the memory holes MH1 and MH2 and the insulating film 57. The insulating film 63 is, for example, a silicon oxide film.

Figure 8A:
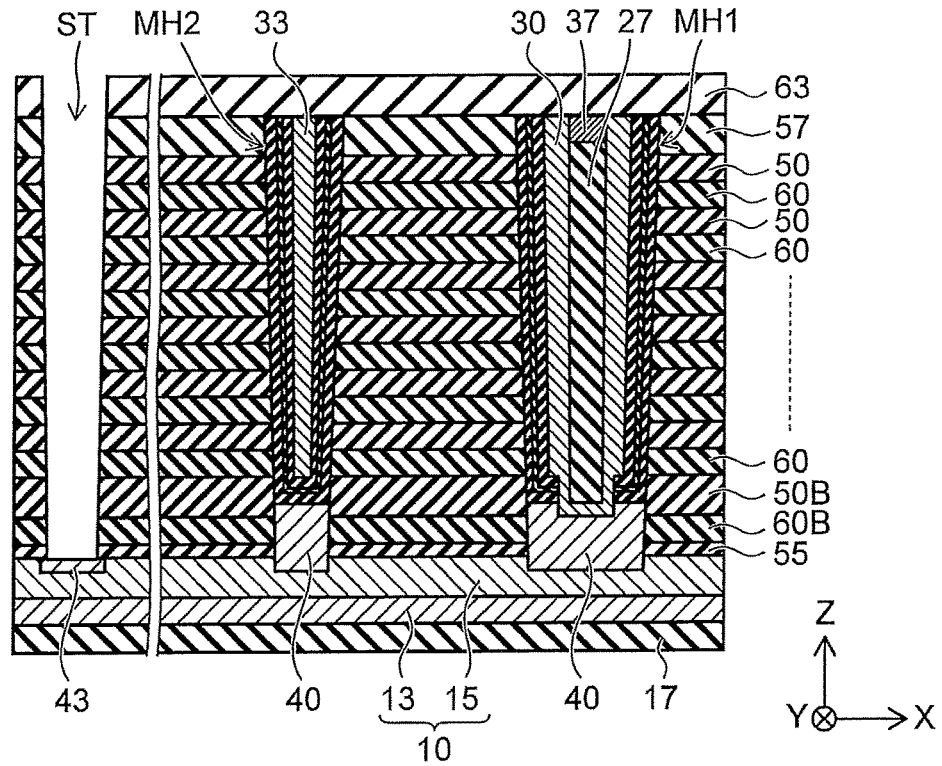

As shown in FIG. 8A, the first slit ST is formed to have a depth from the upper surface of the insulating film 63 such that the bottom thereof reaches the semiconductor layer 15. For example, the first slit ST is formed using anisotropic RIE and extends in the Y-direction (referring to FIG. 1A). Then, a contact region 43 is formed on the bottom surface of the first slit ST. For example, the contact region 43 is formed by ion implantation of an N-type or a P-type impurity into the semiconductor layer 15 via the first slit ST.

Figure 8B:
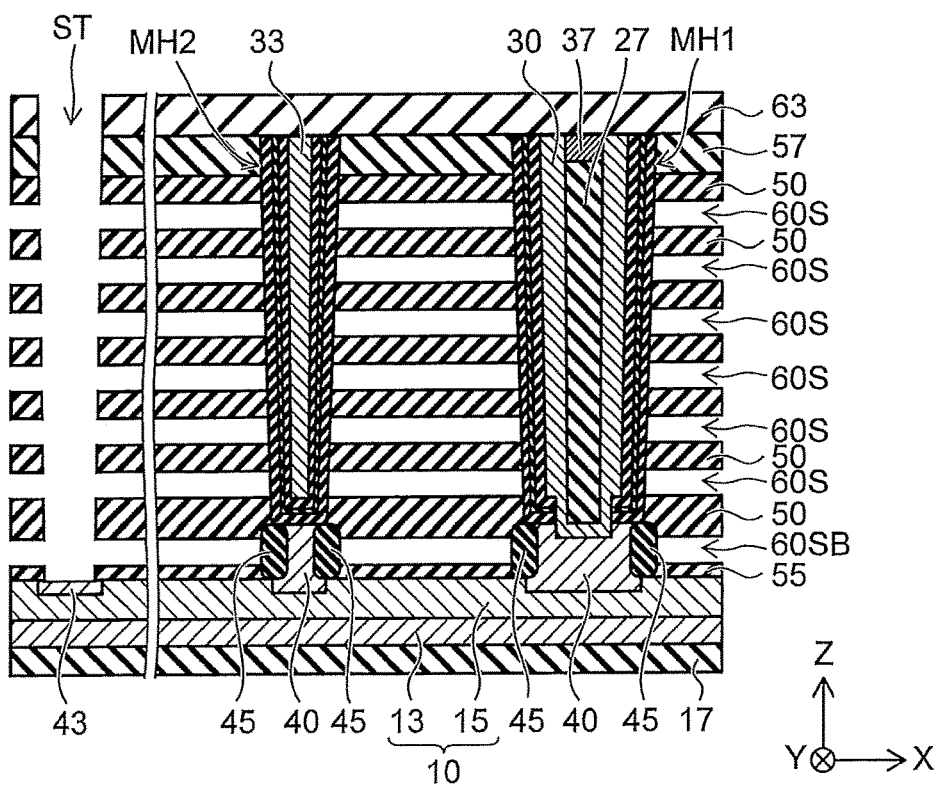

As shown in FIG. 8B, the sacrificial films 60 are selectively removed via the first slit ST. Thereby, spaces 60S are formed between the insulating film 50 and the insulating film 55 and between the insulating films 50 adjacent to each other in the Z-direction. For example, selective wet etching of the sacrificial films 60 is performed using hot phosphoric acid.

Here, if the memory hole MH2 does not reach the source layer 10 in the manufacturing process shown in FIGS. 4A and 4B and, for example, is formed such that the bottom of the memory hole MH2 is positioned at a higher level than the sacrificial film 60B, the semiconductor layer 40 is not formed on the bottom surface of the memory hole MH2 in the manufacturing process shown in FIG. 5A. In such a case, when the sacrificial films 60 are removed via the first slit ST, a large space 60S is formed below the memory hole MH2 by the removal of the sacrificial film 60 remaining below the memory hole MH2. Thereby, a reliability of the word lines WL and/or the select gate SGS positioned below the memory hole MH2 may be lowered due to a void remaining in a metal layer 70 formed inside the spaces 60S (referring to FIG. 9A), etc. Accordingly, it is desirable for the memory hole MH2 to be formed with a depth such that the bottom thereof reaches the source layer 10.

Then, an insulating film 45 is formed on the side surface of the semiconductor layer 40. The insulating film 45 is, for example, a silicon oxide film and is formed by thermal oxidation of the semiconductor layer 40 exposed in a space 60SB. The space 60SB is the space 60S formed by removing the sacrificial film 60B at the lowermost position.

Figure 9A:
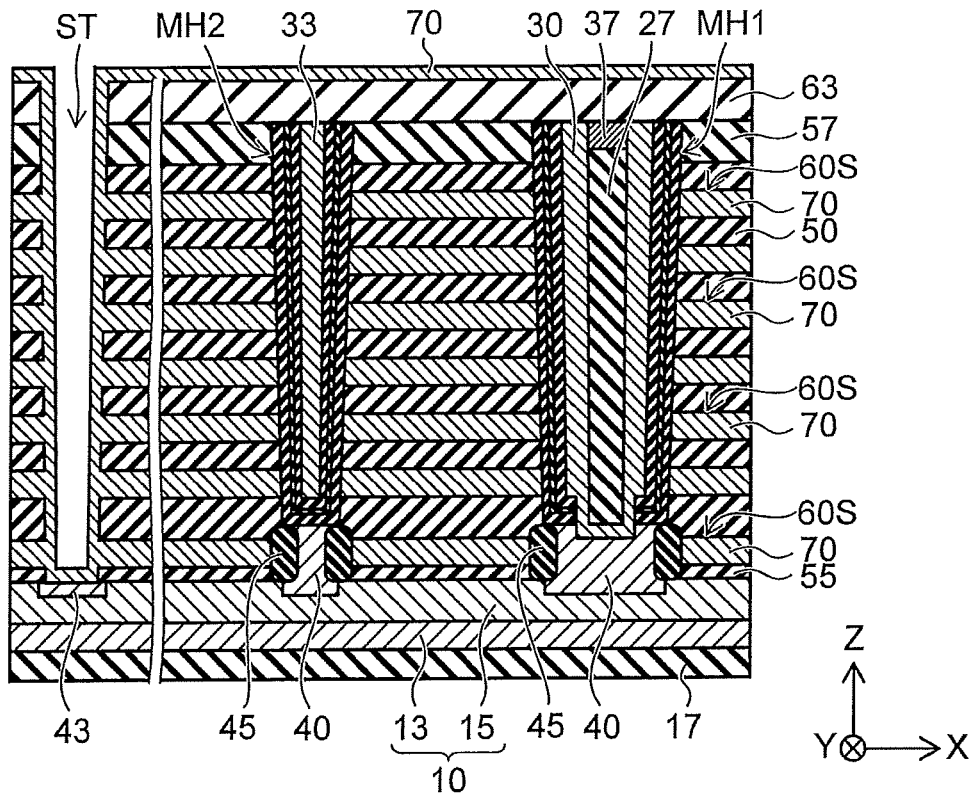

As shown in FIG. 9A, the metal layer 70 is formed in the spaces 60S. For example, the metal layer 70 is formed using CVD and is formed by supplying a source gas to the spaces 60S via the first slit ST. The metal layer 70 includes, for example, tungsten.

In FIG. 9A, the insulating film 53 that covers the inner surfaces of the spaces 60S is not illustrated. The insulating film 53 is, for example, an aluminum oxide film and is deposited using CVD before the metal layer 70 is formed.

Figure 9B:
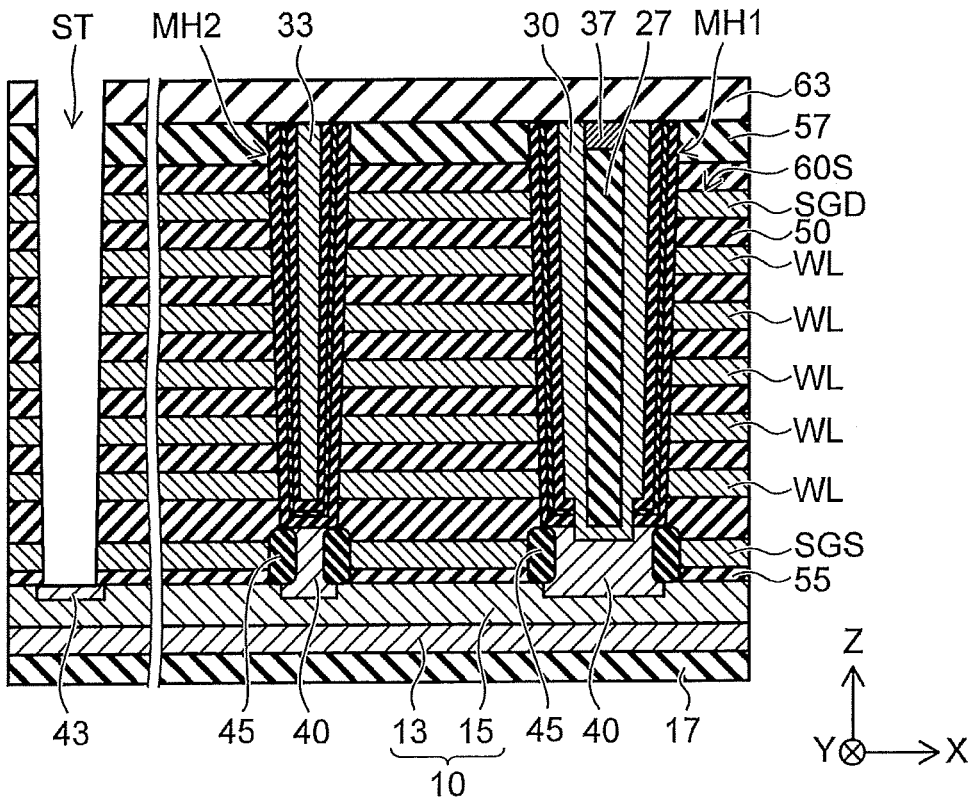

As shown in FIG. 9B, a portion of the metal layer 70 covering the upper surface of the insulating film 63 and the inner surface of the first slit ST is selectively removed. Thereby, the metal layer 70 that fills the spaces 60S is divided into multiple electrode layers; and the word lines WL and the select gates SGS and SGD are formed.

Figure 10A:
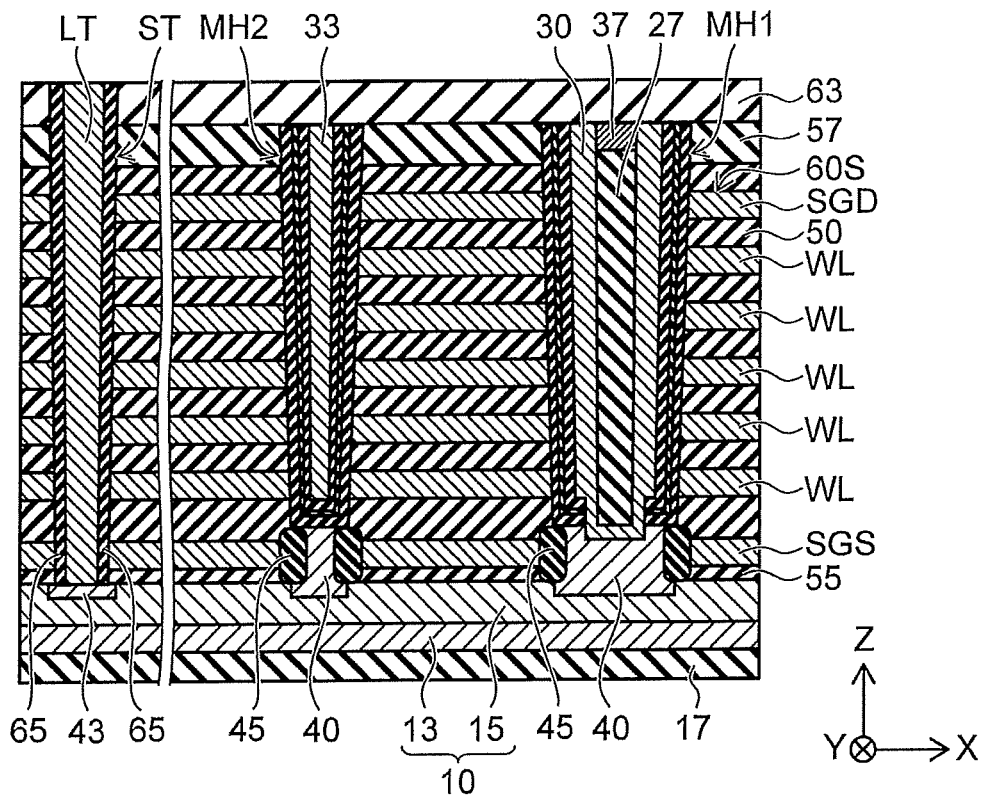

As shown in FIG. 10A, an insulating film 65 and a connection conductor LI are formed in the interior of the first slit ST. The connection conductor LI is connected to the semiconductor layer 15 via the contact region 43. The connection conductor LI electrically connects the source layer 10 and an upper layer interconnect (not-illustrated). The insulating film 65 is, for example, a silicon oxide film and electrically insulates the word lines WL and the select gates SGS and SGD from the connection conductor LI.

Figure 10B:
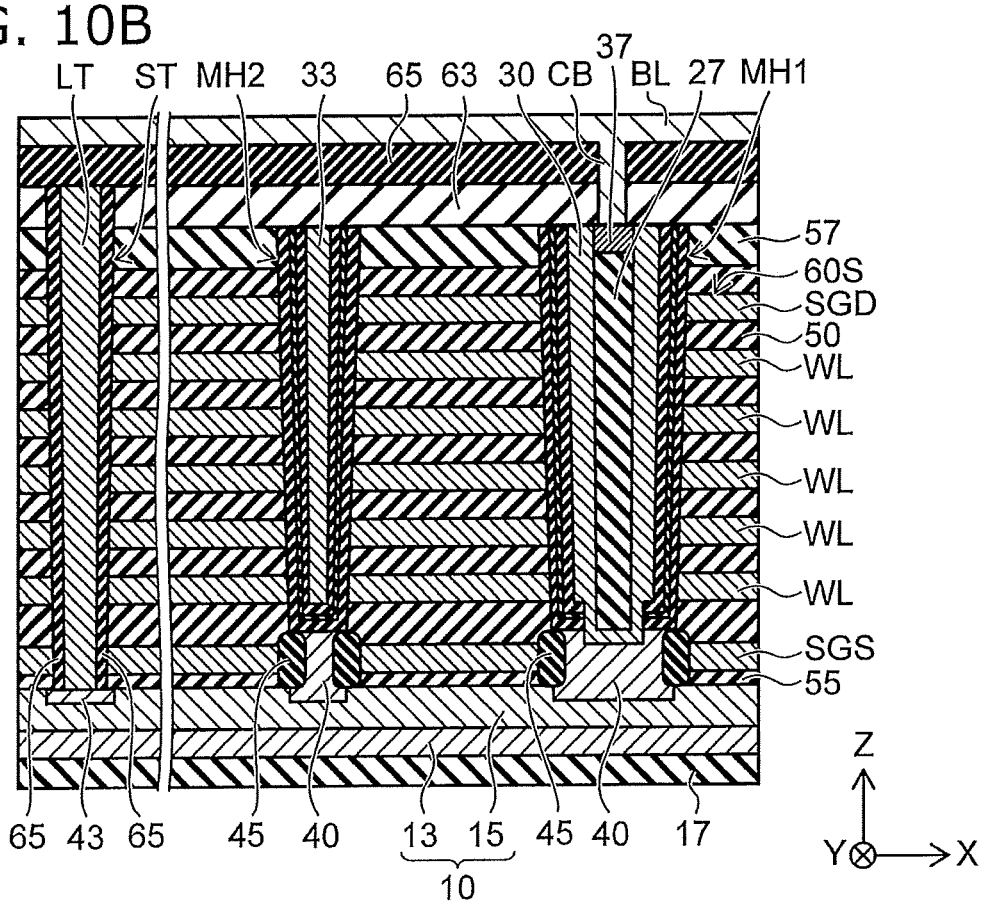

As shown in FIG. 10B, the insulating film 65 that covers the upper surface of the insulating film 63 is formed; and bit lines BL are formed on the insulating film 65. One of the bit line BL is electrically connected to the semiconductor layer 30 inside the memory hole MH1 via a connection plug CB that extends in the Z-direction through the insulating films 63 and 65. On the other hand, the semiconductor layer 33 that is formed inside the memory hole MH2 is not connected to the upper layer interconnect and is electrically insulated from the semiconductor layer 40.

Figure 11:
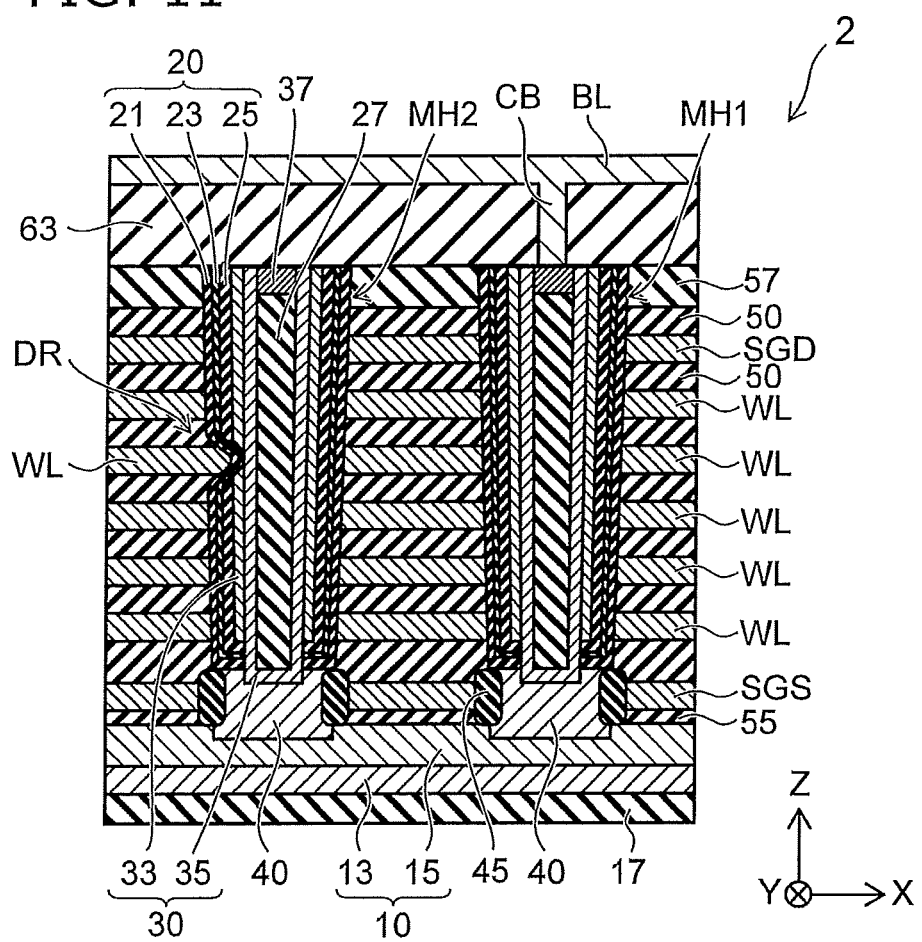
FIG. 11 is a schematic cross-sectional view showing a memory device according to a comparative example.

FIG. 11 is a schematic cross-sectional view showing a memory device 2 according to a comparative example. In the memory device 2, the memory hole MH1 and the memory hole MH2 are formed to have openings of the same size. Therefore, the semiconductor layer 35 is provided also in the memory hole MH2; and the semiconductor layer 30 is electrically connected to the source layer 10 via the semiconductor layer 40.

The memory holes MH are formed by etching the multiple insulating films 50 and the sacrificial films 60 in the stacking direction. At this time, protrusions may occur due to the re-adherence of etched substances to the inner walls of the memory holes MH. Also, there are cases where silicon adheres on the inner walls of the memory holes MH in the formation process of the semiconductor layer 40 shown in FIG. 5A, and becomes a protrusion covered with the memory film 20 and the semiconductor layer 33 formed subsequently.

Such a protrusion on the inner walls of the memory holes MH appears more markedly in the memory hole MH2 that is formed at a region overlaying on the second slit SHE. Then, in the process of the selective etching shown in FIG. 6A, the semiconductor layer 33 that covers the protrusion is etched deeper than the other portions; and the memory film 20 lying under the semiconductor layer 33 may be exposed. Therefore, the memory film 20 also is etched through the process shown in FIG. 6A; and a damage region DR is formed, which includes the thinner memory film 20. As a result, there are cases where the insulation breakdown voltage between the word line WL and the semiconductor layer 30 decreases in the damage region DR.

In the memory hole MH2 of the memory device 2 shown in FIG. 11, the semiconductor layer 30 is electrically connected to the source layer 10. In the memory cells MC provided along the memory hole MH1, an erasing voltage $V_{ERASE}$ is repeatedly applied for erasing the data stored therein. Therefore, the erasing voltage $V_{ERASE}$ is also applied between the semiconductor layer 30 and the word lines WL of the memory hole MH2. Thus, a leakage current between the word lines WL and the semiconductor layer 30 may increase gradually in the damage region DR, resulting in an electrical short between the source layer 10 and the word lines WL.

In contrast, in the memory device 1 according to the embodiment, the interior of the memory hole MH2 is filled with the semiconductor layer 33; further, the semiconductor layer 33 is electrically insulated from the source layer 10 by the memory film 20 remaining on the bottom surface of the memory hole MH2. Therefore, in the process of the selective etching of the memory hole MH1 (referring to FIG. 6A), the damage region DR is not formed in the memory hole MH2; and a high voltage such as the erasing voltage $V_{ERASE}$ is not applied between the semiconductor layer 33 and the word lines WL in the memory hole MH2. Thus, it is possible in the memory device 1 to avoid the degradation of the insulation breakdown voltage, and to improve the reliability thereof.

Second Embodiment

Figure 12A:
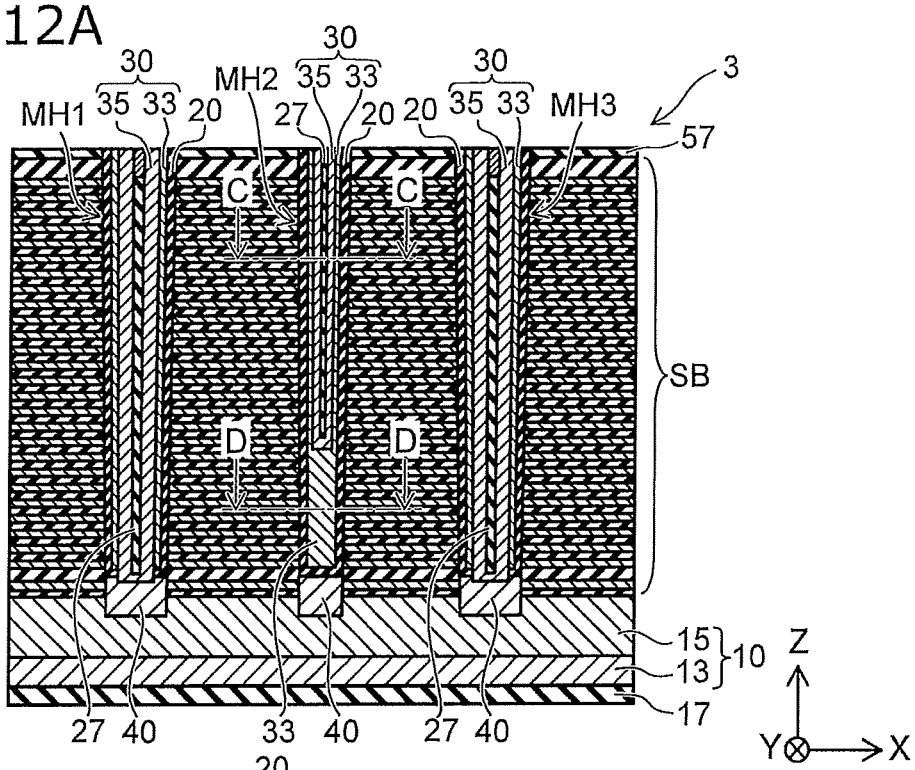
FIGS. 12A to 12C are schematic views showing a memory device according to a second embodiment.
Figure 12B:
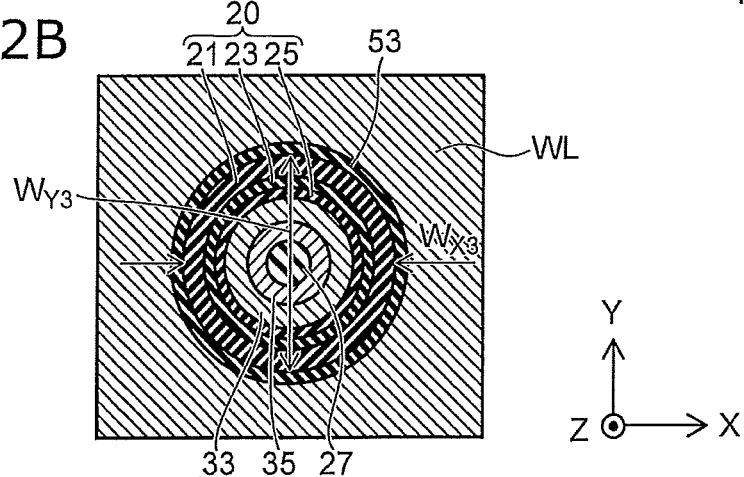
Figure 12C:
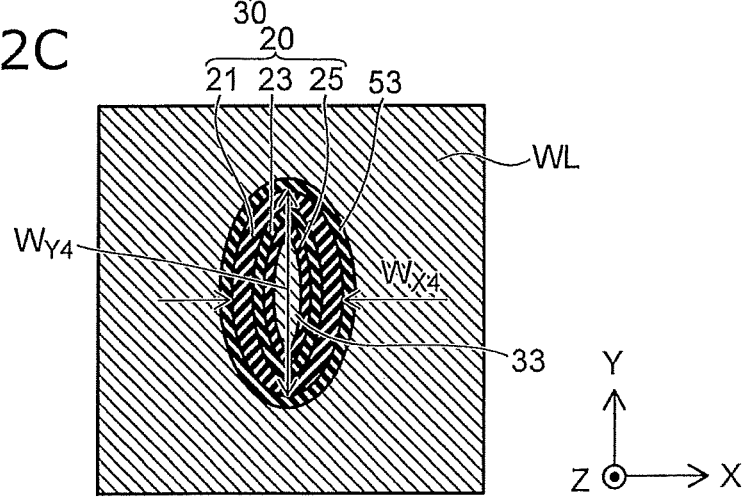

FIGS. 12A to 12C are schematic views showing a memory device 3 according to a second embodiment. FIG. 12A is a cross-sectional view corresponding to the cross section along line A-A shown in FIG. 1B. FIGS. 12B and 12C are cross-sectional views corresponding respectively to cross sections along line C-C and line D-D shown in FIG. 12A.

As shown in FIGS. 12A to 12C, the memory hole MH1 of the memory device 3 includes the insulating core 27 that extends from the opening to a level in the vicinity of the bottom surface, and the semiconductor layer 30 that surrounds the insulating core 27 and extends in the Z-direction. The semiconductor layer 30 contacts the semiconductor layer 40 at the bottom surface of the memory hole MH1. In contrast, the memory hole MH2 includes a lower portion that is filled with the memory film 20 and the semiconductor layer 33, and an upper portion that further includes the semiconductor layer 35 and the insulating core 27.

As shown in FIGS. 12B and 12C, the memory hole MH2 has the cross section parallel to the X-Y plane that is, for example, a circle at the upper portion and an ellipse at the lower portion. Therefore, the lower portion of the memory hole MH2 is plugged with the semiconductor layer 33; and the semiconductor layer 35 and the insulating core 27 do not extend from the upper portion to the lower portion. The memory film 20 extends along the inner surface of the memory hole MH2 and includes a portion interposed between the semiconductor layer 33 and the semiconductor layer 40.

The memory hole MH2 includes the semiconductor layer 30 that is provided at the upper portion, and the semiconductor layer 33 that is provided at the lower portion. The memory hole MH2 has an inner perimeter width $W_{X3}$ in the X-direction and an inner perimeter width $W_{Y3}$ in the Y-direction at the upper portion, and has an inner perimeter width $W_{X4}$ in the X-direction and an inner perimeter width $W_{Y4}$ in the Y-direction at the lower portion. The ratio ($W_{Y3}/W_{X3}$) of $W_{Y3}$ to $W_{X3}$ is smaller than the ratio ($W_{Y4}/W_{X4}$) of $W_{Y4}$ to $W_{X4}$.

Figure 13A:
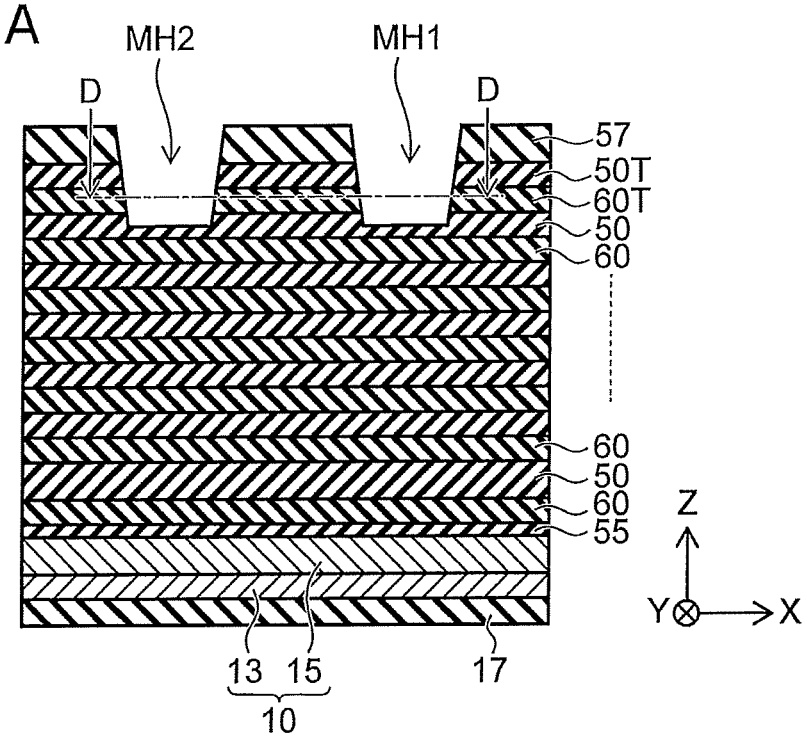
FIGS. 13A to 13C are schematic views showing manufacturing processes of the memory device according to the second embodiment.
Figure 13B:
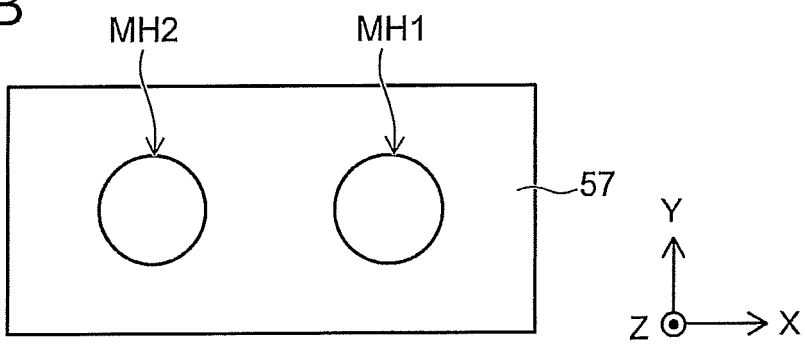
Figure 13C:
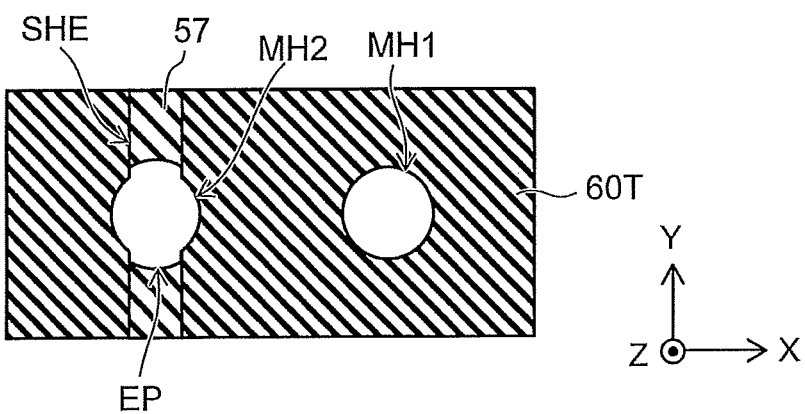

FIGS. 13A to 13C are schematic views showing manufacturing processes of the memory device 3 according to the second embodiment. The memory holes MH according to the embodiment are formed by etching processes in two stages. FIGS. 13A to 13C are schematic views illustrating the memory holes MH formed by the etching in the first stage.

FIG. 13A is a schematic view showing a cross section corresponding to FIG. 4B. FIG. 13B is a schematic view showing the openings provided in the upper surface of the insulating film 57; and FIG. 13C is a schematic view showing a cross section along line D-D shown in FIG. 13A.

As shown in FIG. 13A, the memory holes MH are formed in the first stage by selectively removing the insulating film 57, the insulating film 50T, the sacrificial film 60T, and the insulating film 50 directly under the sacrificial film 60T. For example, the memory holes MH in the first stage are formed using isotropic etching or RIE under the conditions where the anisotropy is suppressed.

As shown in FIG. 13B, for example, the memory holes MH1 and MH2 have circular openings; and the diameters of the openings are the same.

As shown in FIG. 13C, the memory hole MH1 has a circular configuration in a cross section at a level corresponding to the sacrificial film 60T. In contrast, the memory hole MH2 includes an extended portion EP extending along the second slit SHE in the +Y direction and the -Y direction. In such a case, the etching rate of the sacrificial film 60T is slower than the etching rates of the insulating films 50 and 57. Thus, the cross-sectional shape of the memory hole MH2 changes in the second slit SHE where the sacrificial film 60T is selectively removed.

Then, in the etching process of the second stage, for example, the memory holes MH1 and MH2 are further extended down using anisotropic RIE and are formed to have depths reaching the semiconductor layer 15. Although the memory hole MH1 is formed to have, for example, a substantially circular cross-section to the bottom portion, the memory hole MH2 is formed to have an elliptical cross-section at the lower portion due to the effect of the deformation caused by the second slit SHE (referring to FIG. 12C).

Then, the memory device 3 is formed by the processes of FIG. 5A and subsequent drawings. For example, after forming the memory film 20 and the semiconductor layer 33 as shown in FIG. 5B, the lower portion of the memory hole MH2 is plugged with the semiconductor layer 33. On the other hand, a space remains at the upper portion of the memory hole MH2; and the semiconductor layer 35 and the insulating core 27 are formed by subsequent processes.

Also, in the memory device 3, the lower portion of the memory hole MH2 is filled with the semiconductor layer 33; thus, the memory film 20 remains on the bottom surface of the memory hole MH2. Thereby, the semiconductor layers 33 and 35 inside the memory hole MH2 are electrically insulated from the source layer 10. Thus, the degradation over time of the insulation breakdown voltage can be avoided between the semiconductor layer 30 and the word lines WL, when a high voltage is applied for erasing data.

The embodiment is not limited to the example recited above. For example, in the first embodiment, the memory hole MH2 is not always filled completely with the semiconductor layer 33. For example, a space may remain in the upper portion of the memory hole MH2, resulting in a structure in which the insulating core 27 is included in the upper portion of the memory hole MH2 as shown in FIG. 12A.

It is sufficient in the first embodiment and the second embodiment that the cross-sectional shape or the opening size of the memory hole MH2 is controlled so that at least the lower portion of the memory hole MH2 is plugged with the semiconductor layer 33, for example, at a level corresponding to the electrode layer positioned at the lowermost level in the stacked body SB.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A memory device, comprising:
a foundation layer of conductive or semi-conductive;
a plurality of first electrode layers stacked above the foundation layer;
a second electrode layer provided above the plurality of first electrode layers;
a first columnar body extending through the plurality of first electrode layers and the second electrode layer in a stacking direction of the plurality of first electrode layers, the first columnar body including a first semiconductor layer extending in the stacking direction;
a third electrode layer provided above the plurality of first electrode layers, and arranged with the second electrode layer in a first direction crossing the stacking direction;
a second columnar body extending in the stacking direction through the plurality of first electrode layers and the third electrode layer, the second columnar body including a second semiconductor layer extending in the stacking direction; and
a third columnar body extending in the stacking direction through the plurality of first electrode layers, the third columnar body being positioned between the second electrode layer and the third electrode layer, the third columnar body including a third semiconductor layer extending in the stacking direction,
the first semiconductor layer and the second semiconductor layer being electrically connected to the foundation layer,
the third columnar body including an insulating film positioned between the foundation layer and the third semiconductor layer, the insulating film electrically insulating the third semiconductor layer from the foundation layer, wherein
the first columnar body has a first maximum diameter and a first minimum diameter in a prescribed cross section crossing the stacking direction, the prescribed cross section being shared with the first columnar body, the second columnar body and the third columnar body, a first ratio being defined as a ratio of the first maximum diameter divided by the first minimum diameter,
the second columnar body has a second maximum diameter and a second minimum diameter in the prescribed cross section, a second ratio being defined as a ratio of the second maximum diameter divided by the second minimum diameter,
the third columnar body has a major diameter and a minor diameter in the prescribed cross section, a third ratio being defined as a ratio of the major diameter divided by the minor diameter, and
the first ratio and the second ratio are equal to or larger than 1, and the third ratio is larger than the first ratio and the second ratio.

2. The memory device according to claim 1, wherein
the first columnar body has a first width in the prescribed cross section crossing the stacking direction,
the second columnar body has a second width in the prescribed cross section,
the third columnar body has a third width in the prescribed cross section, and
the third width is narrower than the first width and the second width.

3. The memory device according to claim 1, wherein the first ratio and the second ratio are substantially 1.

4. The memory device according to claim 2, wherein the prescribed cross section is positioned at a level corresponding to a lowermost first electrode layer of the plurality of first electrode layers, the lowermost first electrode layer being most proximal to the foundation layer.

5. The memory device according to claim 1, wherein
the second electrode layer and the third electrode layer extend in a second direction, the second direction crossing the stacking direction and the first direction, and
the third columnar body has a width in the second direction wider than another width in the first direction.

6. The memory device according to claim 1, wherein
the first columnar body and the second columnar body each include a charge storage film extending in the stacking direction and surrounding the first semiconductor layer or the second semiconductor layer, and
the insulating film of the third columnar body extends in the stacking direction, and surrounds the third semiconductor layer.

7. The memory device according to claim 1, further comprising:

fourth semiconductor layers provided respectively between the foundation layer and the first columnar body, between the foundation layer and the second columnar body, and between the foundation layer and the third columnar body, the insulating film being positioned between the third semiconductor layer and one of the fourth semiconductor layers, the one of the fourth semiconductor layers being provided between the foundation layer and the third columnar body.

8. The memory device according to claim 7, wherein the foundation layer has a structure including a first layer and a second layer, the second layer being stacked on the first layer, the first layer including a metal, the second layer including a semiconductor, and the second layer is positioned between the first layer and the fourth semiconductor layers and connected to the fourth semiconductor layers.

9. The memory device according to claim 8, wherein each of the fourth semiconductor layers is an epitaxial layer formed on the second layer.

10. The memory device according to claim 1, further comprising:

an inter-layer insulating film covering an upper end of the third columnar body; and a plurality of interconnects provided on the inter-layer insulating film, the plurality of interconnects including interconnects electrically connected to the first semiconductor layer and the second semiconductor layer, respectively, the third semiconductor layer being not electrically connected to any of the plurality of interconnects.

11. The memory device according to claim 1, wherein the first columnar body and the second columnar body each include a first insulating body extending in the stacking direction and being surrounded with the first semiconductor layer or the second semiconductor layer.

12. The memory device according to claim 11, wherein the third columnar body includes a second insulating body extending in the stacking direction and being surrounded with the third semiconductor layer, and the second insulating body is positioned at a level higher than a lowermost first electrode layer of the plurality of first electrode layers, the lowermost first electrode layer being most proximal to the foundation layer.

13. A memory device, comprising:

a plurality of first electrode layers stacked to be separated from each other;

a second electrode layer arranged in a stacking direction of the plurality of first electrode layers when viewed from the plurality of first electrode layers;

a third electrode layer arranged in the stacking direction when viewed from the plurality of first electrode layers, the third electrode layer being arranged with the second electrode layer in a first direction crossing the stacking direction;

a first columnar body extending in the stacking direction through the plurality of first electrode layers and the second electrode layer;

a second columnar body extending in the stacking direction through the plurality of first electrode layers and the third electrode layer; and a third columnar body extending in the stacking direction through the plurality of first electrode layers, the third columnar body being positioned between the second electrode layer and the third electrode layer, the third columnar body having a major diameter and a minor diameter in a prescribed cross section crossing the stacking direction, the prescribed cross section being shared with the first columnar body, the second columnar body and the third columnar body, a ratio of the major diameter divided by the minor diameter being greater than 1, each of the first columnar body and the second columnar body having a minimum width in the prescribed cross section, the minimum width being wider than the minor diameter.

14. The memory device according to claim 13, wherein the prescribed cross section is positioned at a level corresponding to a lowermost first electrode layer of the plurality of first electrode layers, the lowermost first electrode layer being most distal to the second electrode layer and the third electrode layer.

15. The memory device according to claim 13, wherein the second electrode layer and the third electrode layer extend in a second direction, the second direction crossing the stacking direction and the first direction, and the third columnar body has a shape in the prescribed cross section, the shape having the major diameter in the second direction and the minor diameter in the first direction.

16. The memory device according to claim 13, wherein the first columnar body has a first shape in the prescribed cross section, the first shape having a first maximum diameter and a first minimum diameter, a first ratio being defined as a ratio of the first maximum diameter divided by the first minimum diameter, the second columnar body has a second shape in the prescribed cross section, the second shape having a second maximum diameter and a second minimum diameter, a second ratio being defined as a ratio of the second maximum diameter divided by the second minimum diameter, and the first ratio and the second ratio are substantially 1.

17. The memory device according to claim 13, further comprising:

an inter-layer insulating film covering an upper end of the third columnar body; and a plurality of interconnects provided on the inter-layer insulating film, the first columnar body including a first semiconductor layer extending in the stacking direction, the second columnar body including a second semiconductor layer extending in the stacking direction, the third columnar body including a third semiconductor layer extending in the stacking direction, the plurality of interconnects including interconnects electrically connected to the first semiconductor layer and the second semiconductor layer, respectively, the third semiconductor layer not being electrically connected to any of the plurality of interconnects.

18. The memory device according to claim 13, wherein the first columnar body includes a first semiconductor layer extending in the stacking direction, the second columnar body includes a second semiconductor layer extending in the stacking direction, and the first columnar body and the second columnar body each include a first insulating body extending in the stacking direction, the first insulating body being surrounded with the first semiconductor layer or the second semiconductor layer.

19. The memory device according to claim 18, wherein
the third columnar body includes a third semiconductor
  layer extending in the stacking direction and a second
  insulating body extending in the stacking direction, the
  third columnar body being surrounded with the third
  semiconductor layer,
the third columnar body including the third semiconductor layer without including the second insulating body
  at a level corresponding to a lowermost first electrode
  layer of the plurality of first electrode layers, the
  lowermost first electrode layer being most distal to the
  second electrode layer and the third electrode layer.

\* \* \* \* \*